United States Patent
Usuda et al.

(10) Patent No.: US 10,020,035 B2
(45) Date of Patent: Jul. 10, 2018

(54) RECEPTION CIRCUIT

(71) Applicant: TOSHIBA MEMORY CORPORATION, Minato-ku (JP)

(72) Inventors: Masayuki Usuda, Ota (JP); Hiroo Yabe, Nerima (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 15/421,800

(22) Filed: Feb. 1, 2017

(65) Prior Publication Data
US 2018/0068697 A1   Mar. 8, 2018

Related U.S. Application Data

(60) Provisional application No. 62/384,524, filed on Sep. 7, 2016.

(51) Int. Cl.
| | | |
|---|---|---|
| G11C 7/10 | (2006.01) | |
| G11C 7/22 | (2006.01) | |
| G11C 29/02 | (2006.01) | |

(52) U.S. Cl.
CPC .......... *G11C 7/222* (2013.01); *G11C 7/10* (2013.01); *G11C 29/023* (2013.01)

(58) Field of Classification Search
CPC .......... G11C 7/222; G11C 7/10; G11C 29/023
USPC .................................................. 365/189.05
See application file for complete search history.

(56) References Cited

U.S. PATENT DOCUMENTS

| | | | | |
|---|---|---|---|---|
| 5,923,198 | A | 7/1999 | Fujioka | |
| 6,959,058 | B2 | 10/2005 | Yoo et al. | |
| 2008/0059829 | A1* | 3/2008 | Boskovic | G06F 1/06 713/600 |
| 2011/0239063 | A1* | 9/2011 | Zerbe | G06F 13/1689 714/719 |
| 2017/0110197 | A1* | 4/2017 | Park | G11C 16/28 |

FOREIGN PATENT DOCUMENTS

| | | |
|---|---|---|
| JP | 3832932 | 10/2006 |
| JP | 4063392 | 3/2008 |
| JP | 4317336 | 8/2009 |

* cited by examiner

*Primary Examiner* — Huan Hoang
(74) *Attorney, Agent, or Firm* — Oblon, McClelland, Maier & Neustadt, L.L.P.

(57) ABSTRACT

According to one embodiment, a skew correcting device includes a skew calculation circuit and a sampling timing correction circuit. The skew calculation circuit calculates a skew between data and a strobe signal based on sampling values obtained by sampling, at a cycle one half of or shorter than one half of a cycle of the strobe signal, the data and the strobe signal respectively based on a same clock. The sampling timing correction circuit corrects the sampling timing of the data based on the skew calculated by the skew calculation circuit.

20 Claims, 7 Drawing Sheets

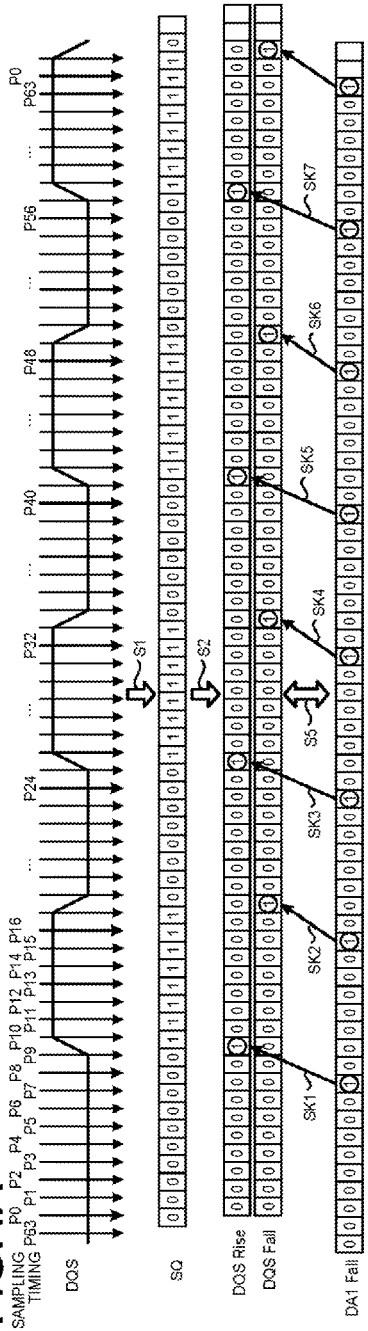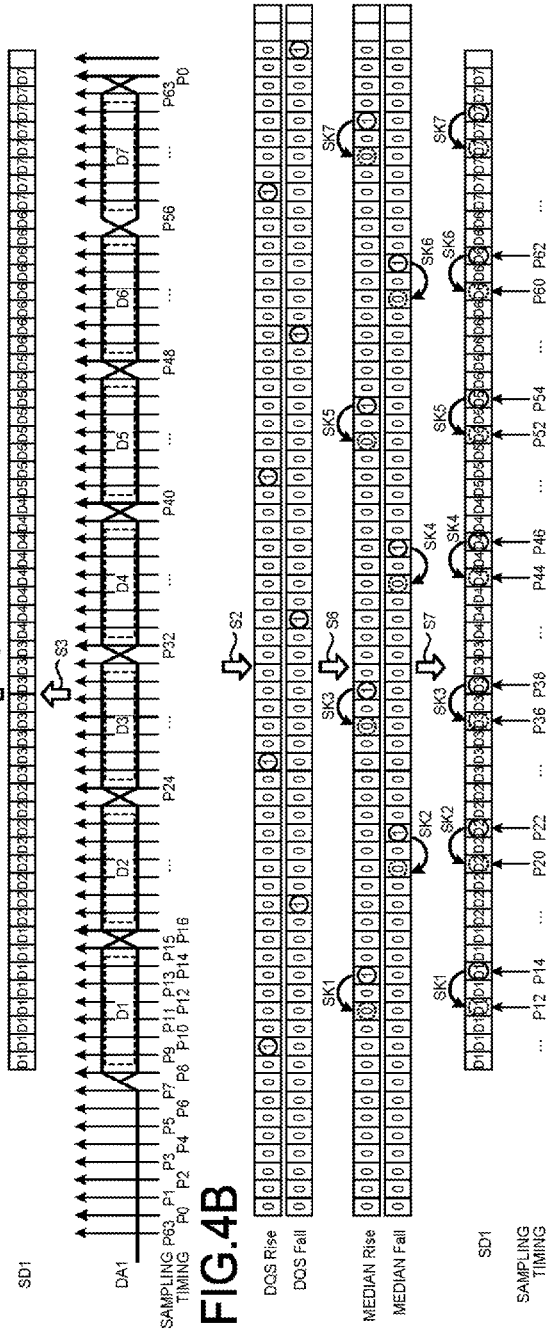

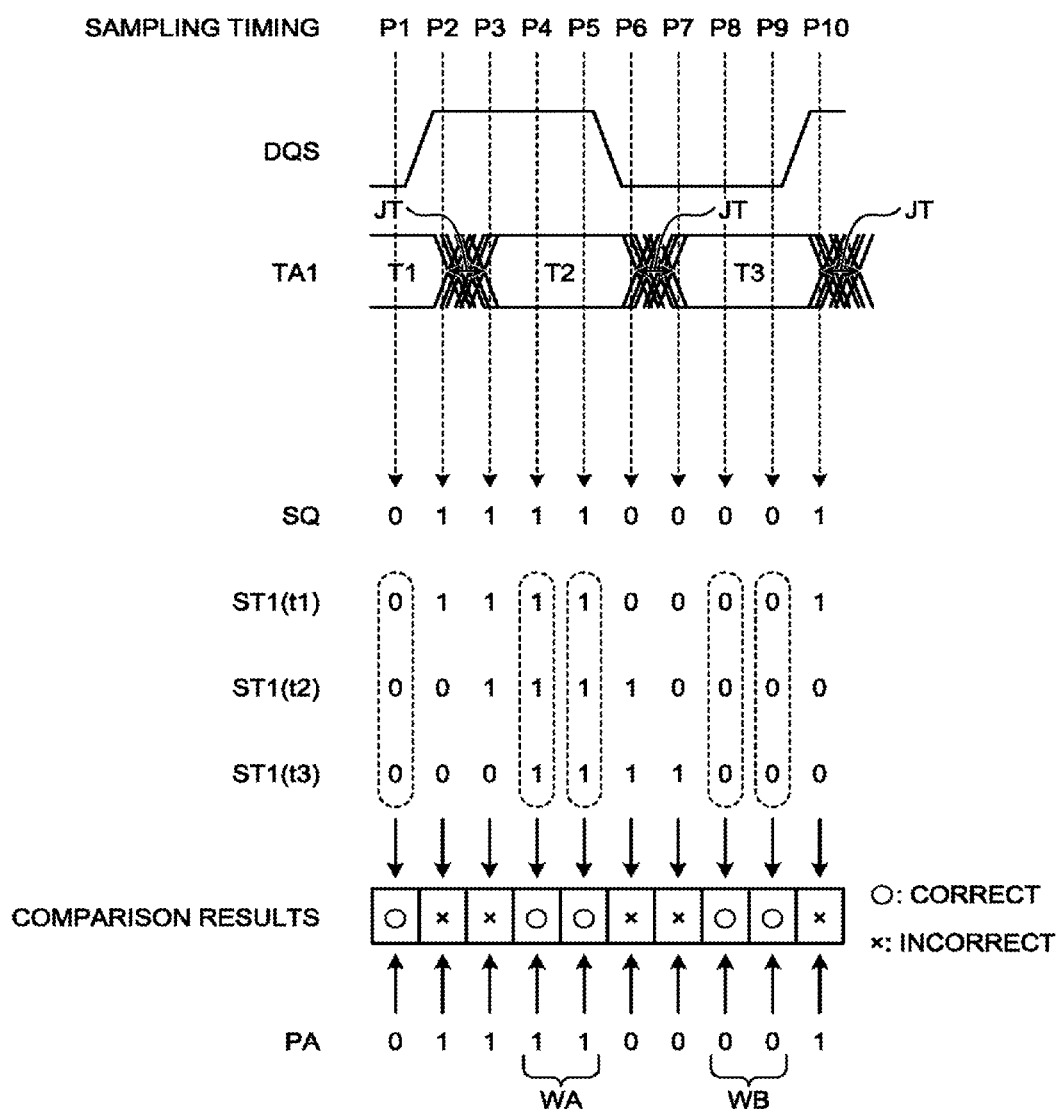

○: CORRECT
×: INCORRECT

RECEPTION CIRCUIT

CROSS-REFERENCE TO RELATED APPLICATIONS

This application is based upon and claims the benefit of priority from U.S. Provisional Application No. 62/384,524, filed on Sep. 7, 2016; the entire contents of which are incorporated herein by reference.

FIELD

Embodiments described herein relate generally to a reception circuit.

BACKGROUND

A data receiving device may receive strobe signals together with data to define timings for data capture.

BRIEF DESCRIPTION OF THE DRAWINGS

FIG. 4A is a timing chart describing operations of the skew calculation process according to the second embodiment, and FIG. 4B is a timing chart describing operations in a data selection process according to the second embodiment;

FIG. 6 is a timing chart describing a test pattern receiving operation of the skew correcting device with jitter according to the third embodiment.

DETAILED DESCRIPTION

In general, according to one embodiment, a skew correcting device includes a skew calculation circuit and a sampling timing correction circuit. The skew calculation circuit calculates a skew between data and a strobe signal based on sampling values obtained by sampling, at a cycle one half of or shorter than one half of a cycle of the strobe signal, the data and the strobe signal respectively based on a same clock. The sampling timing correction circuit corrects the sampling timing of the data based on the skew calculated by the skew calculation circuit.

Exemplary embodiments of skew correcting device will be explained below in detail with reference to the accompanying drawings. The present invention is not limited to the following embodiments.

First Embodiment

Figure 1:
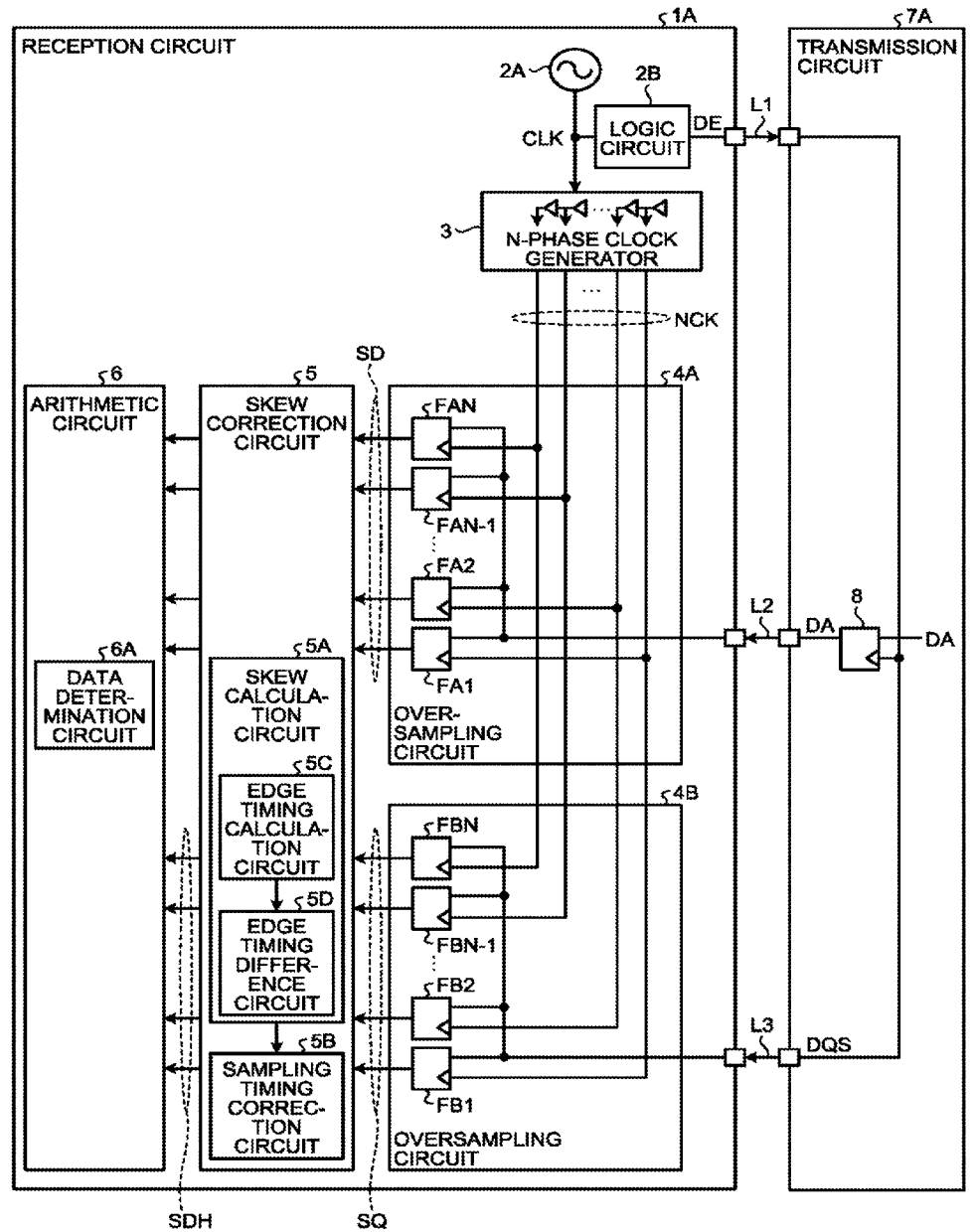
FIG. 1 is a schematic block diagram of a communication system to which a skew correcting device according to a first embodiment is applied.

FIG. 1 is a schematic block diagram of a communication system to which a skew correcting device according to a first embodiment is applied.

Referring to FIG. 1, the communication system includes a reception circuit 1A and a transmission circuit 7A. The reception circuit 1A and the transmission circuit 7A are connected together via signal lines L1 to L3. The signal line L1 can transmit a data capture signal DE from the reception circuit 1A to the transmission circuit 7A. The signal line L2 can transmit data DA from the transmission circuit 7A to the reception circuit 1A.

In the example of FIG. 1, 1-bit data DA is transmitted via the signal line L2. Alternatively, n (n represents a positive integer)-bit data DA may be transmitted in parallel. The signal line L3 can transmit a data strobe signal DQS from the transmission circuit 7A to the reception circuit 1A. The reception circuit 1A can be used as a receiving interface mounted on a semiconductor integrated circuit and the transmission circuit 7A can be used as a transmitting interface mounted on a semiconductor integrated circuit.

The reception circuit 1A includes a clock generator 2A, a logic circuit 2B, an N (N represents an integer of 2 or larger)-phase clock generator 3, oversampling circuits 4A and 4B, a skew correction circuit 5, and an arithmetic circuit 6. The skew correction circuit 5 and the arithmetic circuit 6 can be digital circuits. The clock generator 2A can generate a clock CLK. The logic circuit 2B can generate the data capture signal DE based on the clock CLK. The N-phase clock generator 3 can generate an N-phase clock NCK based on the clock CLK. The N-phase clock generator 3 can be provided with an N-stage delay circuit to delay the clock CLK. In this case, the N-phase clock NCK can be output from the stages of the delay circuit.

The oversampling circuit 4A can oversample the data DA according to the N-phase clock NCK. The oversampling circuit 4A includes N latch circuits FA1 to FAN corresponding to the phases of the N-phase clock NCK. The latch circuits FA1 to FAN can latch the data DA at rises in the phases of the N-phase clock NCK.

The oversampling circuit 4B can oversample the data strobe signal DQS according to the N-phase clock NCK. The oversampling circuit 4B includes N latch circuits FB1 to FBN corresponding to the phases of the N-phase clock NCK. The latch circuits FB1 to FBN can latch the data strobe signal DQS at the rises in the phases of the N-phase clock NCK.

The oversampling means to sample the data strobe signal DQS at a cycle one half of or shorter than one half of a cycle of the strobe signal DQS. A cycle of the data strobe signal DQS is same as a cycle of the clock CLK.

The skew correction circuit 5 can correct a skew between the data DA and the data strobe signal DQS. The skew correction circuit 5 includes a skew calculation circuit 5A and a sampling timing correction circuit 5B. The skew calculation circuit 5A includes an edge timing calculation circuit 5C and an edge timing difference circuit 5D.

The skew calculation circuit 5A can calculate a skew between the data DA and the data strobe signal DQS based on sampling values SD and SQ obtained by oversampling the data DA and the data strobe signal DQS respectively at the same time. The oversampling the data DA and the data strobe signal DQS at the same time means to oversample the data DA and the data strobe signal DQS based on a same clock.

The sampling timing correction circuit 5B can correct the sampling timings of the data DA based on the skew calculated by the skew calculation circuit 5A. The edge timing calculation circuit 5C can calculate the edge timings of the data DA based on the sampling values SD of the data DA and calculate the edge timings of the data strobe signal DQS based on the sampling values SQ of the data strobe signal DQS.

In this case, the sampling timings where the sampling values SD of the data DA change between 0 and 1 can be set as edge timings of the data DA. The sampling timings where the sampling values of the data strobe signal DQS change between 0 and 1 can be set as edge timings of the data strobe signal DQS. The edge timing difference circuit 5D can calculate the differences in edge timing between the data DA and the data strobe signal DQS. At that time, the differences between the edge timings of the data DA and the edge timings of the data strobe signal DQS can be set as skews between the data DA and the data strobe signal DQS.

The arithmetic circuit 6 can determine whether the data DA after the correction of the skews between the data DA and the data strobe signal DQS is 0 or 1. The arithmetic circuit 6 includes a data determination circuit 6A. The data determination circuit 6A can determine whether the data DA is 0 or 1 based on the sampling value SD obtained in the sampling timing after the correction of the skew.

The transmission circuit 7A includes a latch circuit 8. The latch circuit 8 can latch the data DA in synchronization with both the edges of rise and fall of the data capture signal DE, and output the data DA. The transmission circuit 7A can also transmit the data capture signal DE received from the reception circuit 1A as data strobe signal DQS to the reception circuit 1A.

Figure 2:
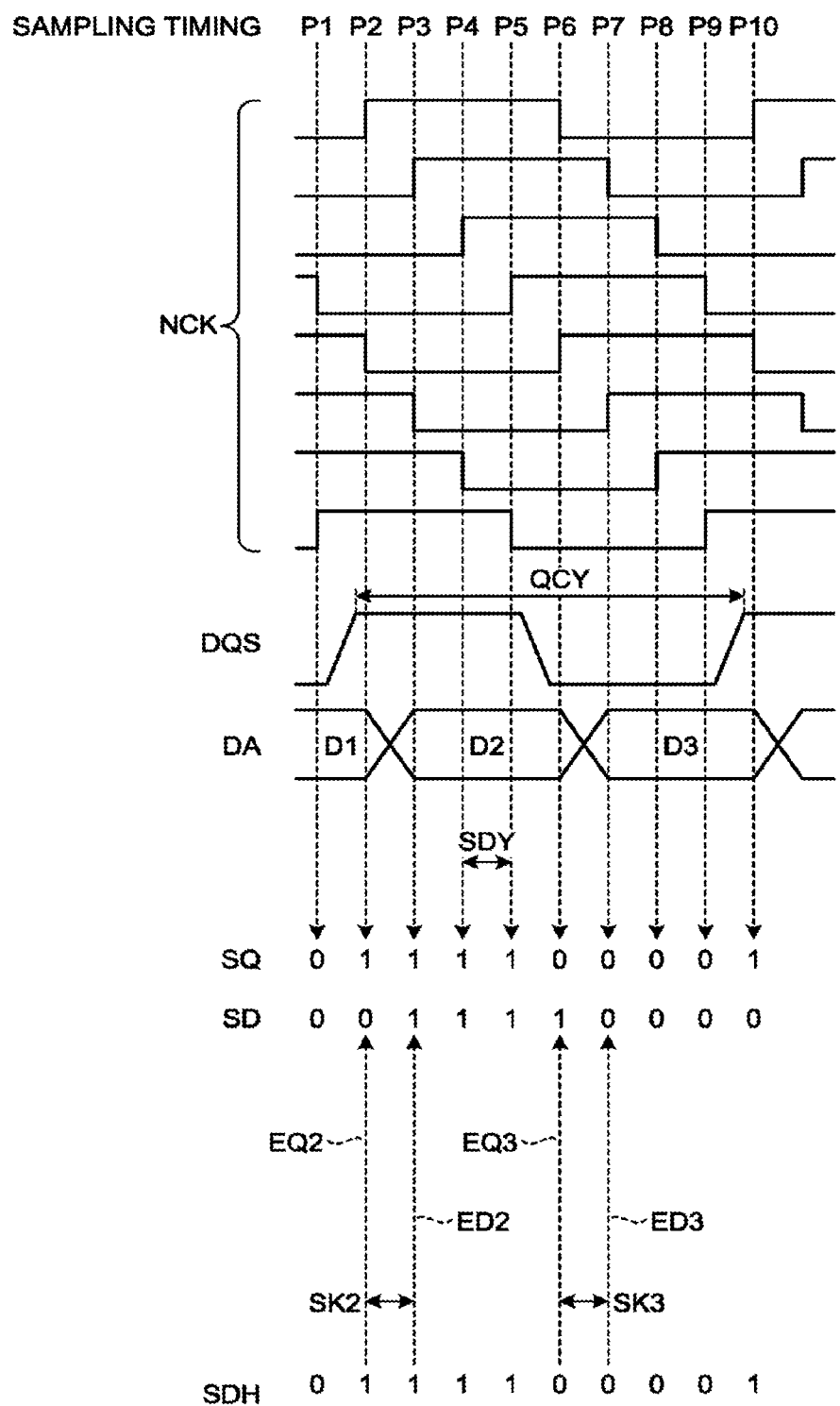
FIG. 2 is a timing chart describing operations of the skew correcting device according to the first embodiment.

FIG. 2 is a timing chart describing operations of the skew correcting device according to the first embodiment.

Referring to FIG. 2, the logic circuit 2B generates the data capture signal DE based on the clock CLK generated by the clock generator 2A, and transmits the same to the transmission circuit 7A. Then, the latch circuit 8 latches the data DA in synchronization with the data capture signal DE and transmits the same to the reception circuit 1A. The latch circuit 8 also transmits the data capture signal DE received from the transmission circuit 7A as data strobe signal DQS to the reception circuit 1A.

The clock CLK generated by the clock generator 2A is input into the N-phase clock generator 3. Then, the N-phase clock generator 3 generates the N-phase clock NCK based on the clock CLK and outputs the same to the oversampling circuits 4A and 4B.

The latch circuits FB1 to FBN latch the data DA in synchronization with the phases of the N-phase clock NCK, whereby the data DA is sampled in sampling timings P1 to 210 and the sampling values SD are generated according to the sampling timings P1 to P10.

The latch circuits FA1 to FAN latch the data strobe signal DQS in synchronization with the phases of the N-phase clock NCK, whereby the data strobe signal DQS is sampled in the sampling timings P1 to P10 and the sampling values SQ are generated according to the sampling timings P1 to P10. A sampling cycle SDY of the data strobe signal DQS is a cycle one half of or shorter than one half of a cycle QCY of the data strobe signal DQS. For example, in the case of DDR (Double Data Rate), a sampling cycle SDY of the data strobe signal DQS is a cycle one half of or shorter than one half of a cycle QCY of the data strobe signal DQS.

Then, the edge timing calculation circuit 5C calculates the edge timings of the data DA based on the sampling values SD of the data DA, and calculates the edge timings of the data strobe signal DQS based on the sampling values SQ of the data strobe signal DQS. At that time, the edge timings of the data DA can be sampling timings where the sampling values SD change between 0 and 1. The edge timings of the data strobe signal DQS can be sampling timings where the sampling values SQ change between 0 and 1.

For example, in the sampling timings P1 to P10, data D1 to D3 are input as the data DA into the reception circuit 1A. In this case, D1=0, D2=1, and D3=0. An edge timing ED2 of the data D2 can be set as sampling timing P3. An edge timing ED3 of the data D3 can be set as sampling timing P7.

Meanwhile, the data strobe signal DQS can toggle between H level and L level for each word at the time of data transfer. Accordingly, the data strobe signal DQS has a rise edge and a fall edge for each word. In this case, an edge timing EQ2 of the data strobe signal DQS for the data D2 can be set as sampling timing P2. An edge timing EQ3 of the data strobe signal DQS for the data D3 can be set as sampling timing P6.

Next, the edge timing difference circuit 5D calculates the differences between the edge timings of the data DA and the edge timings of the data strobe signal DQS. In this case, the differences between the edge timings of the data DA and the edge timings of the data strobe signal DQS can be set as skews SK between the data DA and the data strobe signal DQS.

For example, when the edge timing ED2 of the data D2 is in the sampling timing P3 and the edge timing EQ2 of the data strobe signal DQS for the data D2 is in the sampling timing P2, a skew SK2 between the data D2 and the data strobe signal DQS can be set as one sampling time.

In addition, when the edge timing ED3 of the data D3 is in the sampling timing P7 and the edge timing EQ3 of the data strobe signal DQS for the data D3 is in the sampling timing P6, a skew SK3 between the data D3 and the data strobe signal DQS can be set as one sampling time.

Next, the sampling timing correction circuit 5B corrects the sampling timings of the data DA based on the skews calculated by the edge timing difference circuit 5D. For example, when the skew SK2 between the data D2 and the data strobe signal DQS is one sampling time, the skew SK2 between the data D2 and the data strobe signal DQS can be corrected by correcting the sampling timing of the sampling value SD of the data D2 by one sampling time. In this case, a sampling value SDH after the correction of the skew SK2 can be generated by shifting the sampling value SQ of the data D2 by the skew SK2.

In addition, when the skew SK3 between the data D3 and the data strobe signal DQS is one sampling time, the skew SK3 between the data D3 and the data strobe signal DQS can be corrected by correcting the sampling timing of the sampling value SD of the data D3 by one sampling time. In this case, a sampling value SDH after the correction of the skew SK3 can be generated by shifting the sampling value SQ of the data D3 by the skew SK3.

Next, the data determination circuit 6A determines whether the data DA is 0 or 1 based on the sampling value SDH after the correction of the skews. For example, it is possible to determine whether the data D2 is 0 or 1 based on the sampling values SDH obtained at the sampling timings P2 to P5 when the sampling value SQ of the data strobe signal DQS is 1. In this case, it is possible to determine correctly that the data D2 is 1 in any of the sampling timings P2 to P5.

In addition, it is possible to determine whether the data D3 is 0 or 1 based on the sampling values SDH obtained in the sampling timings P6 to P9 when the sampling value SQ of the data strobe signal DQS is 0. In this case, it is possible to determine correctly that the data D3 is 0 in any of the sampling timings P6 to P9.

In this case, by calculating the skews between the data DA and the data strobe signal DQS based on the sampling values SD and SQ obtained by oversampling the data DA and the data strobe signal DQS respectively at the same time, it is possible to correct the skews between the data DA and the data strobe signal DQS without using a delay element delaying the data DA and the data strobe signal DQS.

It is possible to suppress degradation in the waveforms of the data DA and the data strobe signal DQS and reduce the circuit area and power consumption as compared to the method by which to correct the skews between the data DA and the data strobe signal DQS by the use of a delay element.

In addition, it is not necessary to adjust the delay amounts of the data DA and the data strobe signal DQS to match the edges of the data DA and the edges of the data strobe signal DQS while comparing the edge timings of the data DA and the edge timings of the data strobe signal DQS. Accordingly, the skew correction can be made faster as compared to the method by which to correct the skews between the data DA and the data strobe signal DQS by the use of a delay element.

The skew calculation can be separately performed for the individual data D1 to D3. In addition, the skews in the data D1 to D3 can be corrected based on the skews calculated for the individual data D1 to D3. This makes it possible to improve the accuracy of skew correction even in the case where the skews vary in the data D1 to D3.

Second Embodiment

Figure 3:
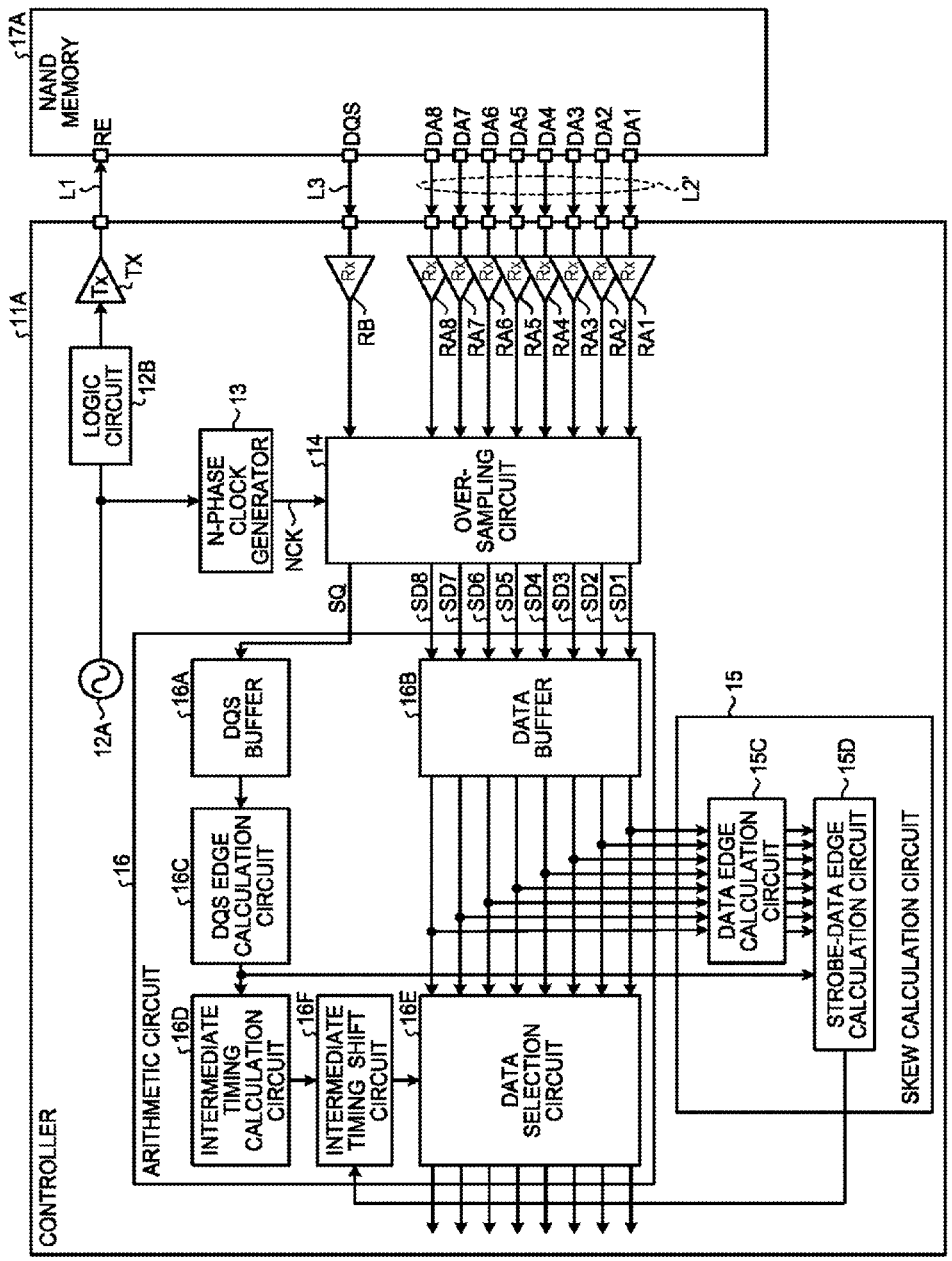
FIG. 3 is a schematic block diagram of a memory system to which a skew correcting device according to a second embodiment is applied.

FIG. 3 is a schematic block diagram of a memory system to which a skew correcting device according to a second embodiment is applied.

Referring to FIG. 3, the memory system includes a controller 11A and an NAND memory 17A. The controller 11A and the NAND memory 17A are connected together via signal lines L1, L2', and L3. The signal line L1 can transmit a read enable signal RE from the controller 11A to the NAND memory 17A. The signal line L2' can transmit data DA1 to DAB from the NAND memory 17A to the controller 11A.

The NAND memory 17A can store the data DA1 to DA8. FIG. 3 illustrates a configuration in which the 8-bit data DA1 to DAB are transmitted in parallel via the signal lines L2'. The signal line L3 can transmit a data strobe signal DQS from the NAND memory 17A to the controller 11A.

The controller 11A includes a transmission buffer TX, reception buffers RA1 to RA8 and RB, a clock generator 12A, a logic circuit 12B, an N-phase clock generator 13, an oversampling circuit 14, a skew calculation circuit 15, and an arithmetic circuit 16. The skew calculation circuit 15 and the arithmetic circuit 16 can be digital circuits.

The output of the transmission buffer TX is connected to the signal line L1, and the input of the transmission buffer TX is connected to the logic circuit 12B. The inputs of the reception buffers RA1 to RA8 are connected to the signal lines L2', and the outputs of the reception buffers RA1 to RA8 are connected to the oversampling circuit 14. The input of the reception buffer RB is connected to the signal line L3, and the output of the reception buffer RB is connected to the oversampling circuit 14.

The clock generator 12A can generate a clock CLK. The logic circuit 12B can generate a read enable signal RE based on the clock CLK. The N-phase clock generator 13 can generate an N-phase clock NCK based on the clock CLK. The N-phase clock generator 13 can be a phase lock loop (PLL) circuit.

The oversampling circuit 14 can oversample the data DA1 to DA8 and the data strobe signal DQS respectively according to the N-phase clock NCK.

The skew calculation circuit 15 can calculate the skews between the data DA1 to DA8 and the data strobe signal DQS. The skew calculation circuit 15 includes a data edge calculation circuit 15C and a strobe-data edge calculation circuit 15D.

The data edge calculation circuit 15C can calculate edge timings of the data DA1 to DA8 based on sampling values SD1 to SD8 of the data DA1 to DA8. In this case, the sampling timings where the sampling values SD1 to SD8 of the data DA1 to DA8 change between 0 and 1 can be set as edge timings of the data DA1 to DA8. The strobe-data edge calculation circuit 15D can calculate differences between the edge timings of the data DA1 to DA8 and the edge timings of the data strobe signal DQS. In this case, the differences between the edge timings of the data DA1 to DA8 and the edge timings of the data strobe signal DQS can be set as skews between the data DA1 to DA8 and the data strobe signal DQS.

The arithmetic circuit 16 can determine whether the data DA1 to DAB are 0 or 1 after the correction of the skews between the data DA1 to DA8 and the data strobe signal DQS. The arithmetic circuit 16 includes a DQS buffer 16A, a data buffer 16B, a DQS edge calculation circuit 16C, an intermediate timing calculation circuit 16D, a data selection circuit 16E, and an intermediate timing shift circuit 16F.

The DQS buffer 16A can hold the sampling value SQ of the data strobe signal DQS. The data buffer 16B can hold the sampling values SD1 to SD8 of the data DA1 to DA8. The DQS edge calculation circuit 16C can calculate the edge timings of the data strobe signal DQS based on the sampling value SQ of the data strobe signal DQS. In this case, the sampling timings where the sampling value SQ of the data strobe signal DQS changes between 0 and 1 can be set as edge timings of the data strobe signal DQS.

The intermediate timing calculation circuit 16D can calculate an intermediate timing between the edge timings of the data strobe signal DQS. The intermediate timing between the edge timings can be set as a central timing between the rising edge timing and the falling edge timing of the data strobe signal DQS. The intermediate timing shift circuit 16F can shift the intermediate timing calculated by the intermediate timing calculation circuit 16D by the skew calculated by the strobe-data edge calculation circuit 15D. The data selection circuit 16E can select the sampling values SD1 to SD8 obtained in the intermediate timing shifted by the intermediate timing shift circuit 16F as the values of the data DA1 to DA8.

FIG. 4A is a timing chart describing operations in a skew calculation process according to the second embodiment, and FIG. 4B is a timing chart describing operations in a data selection process according to the second embodiment. FIGS. 4A and 4B describe the process of the data DA1 out of the data DA1 to DA8 as an example. However, the processes of the data DA2 to DA8 can be performed in parallel to the process of the data DA1.

Referring to FIG. 3, the logic circuit 12B generates the read enable signal RE based on the clock CLK generated by the clock generator 12A, and transmits the same to the NAND memory 17A. The NAND memory 17A transmits the data DA1 to DA8 to the controller 11A in synchronization with the read enable signal RE. The NAND memory 17A also transmits the read enable signal RE received from the controller 11A as the data strobe signal DQS to the controller 11A.

The controller 11A inputs the clock CLK generated by the clock generator 12A to the N-phase clock generator 13. The N-phase clock generator 13 generates the N-phase clock NCK based on the clock CLK and outputs the same to the oversampling circuit 14.

The oversampling circuit 14 samples the data DA1 to DA8 in sampling timings P1 to P63 corresponding to the edge timings of the phases of the N-phase clock NCK, and generates the sampling values SD1 to SD8 corresponding to the sampling timings P1 to P63 as illustrated in FIG. 4A (S3). The sampling values SD1 to SD8 are held in the data buffer 16B. FIG. 4A describes only the sampling value SD1 of the data DA1.

The oversampling circuit 14 also samples the data strobe signal DQS in the sampling timings P1 to P63 corresponding to the edge timings of the phases of the N-phase clock NCK and generates the sampling values SQ corresponding to the sampling timings P1 to P63 as illustrated in FIG. 4A (S1). These sampling values SQ are held in the DQS buffer 16A.

The data edge calculation circuit 15C calculates the edge timings of the data DA1 based on the sampling value SD1 of the data DA1, for example (S4). In this case, the edge timings of the data DA1 can be set as sampling timings where the sampling value SD1 changes between 0 and 1. For example, the data DA1 includes data D1 to D7 and the data D1 to D7 take alternately 0 and 1. In this case, the edge timings of the data DA1 (DA1 Fall) can be set as sampling timings P8, P16, P24, P32, P40, P48, and P56.

Meanwhile, the DQS edge calculation circuit 16C calculates the edge timings of the data strobe signal DQS based on the sampling value SQ of the data strobe signal DQS (S2). In this case, the edge timings of the data strobe signal DQS can be set as sampling timings where the sampling value SQ changes between 0 and 1. For example, the edge timings of the data strobe signal DQS (DQS Rise and DQS Fall) can be set as sampling timings P10, P18, P26, P34, P42, P50, and P58.

Next, the strobe-data edge calculation circuit 15D calculates the differences between the edge timings of the data DA1 and the edge timings of the data strobe signal DQS (S5). In this case, the differences between the edge timings of the data DA1 and the edge timings of the data strobe signal DQS can be set as skews between the data DA1 and the data strobe signal DQS.

For example, when the edge timing of the data D1 of the data DA1 (DA1 Fall) is the sampling timing P8 and the edge timing of the data strobe signal DQS (DQS Rise) is the sampling timing P10, a skew SK1 between the data D1 and the data strobe signal DQS can be set as two sampling times. Also for the data D2 to D7 of the data DA1, skews SK2 to SK7 can be calculated respectively as with the data D1.

Next, the intermediate timing calculation circuit 16D calculates intermediate timings between the edge timings of the data strobe signal DQS based on the edge timings calculated by the DQS edge calculation circuit 16C as illustrated in FIG. 4B (S6).

For example, when the edge timings of the data strobe signal DQS (DQS Rise and DQS Fall) for the data D1 of the data DA1 are the sampling timings P10 and P18, the intermediate timing (median Rise) can be set as the sampling timing P14. Also for the data D2 to D7 of the data DA1, the intermediate timings (median Rise and median Fall) can be calculated respectively as with the data D1.

The processes of the DQS buffer 16A, the DQS edge calculation circuit 16C and the intermediate timing calculation circuit 16D can be executed in parallel with the processes of the data buffer 16B, the data edge calculation circuit 15C and the strobe-data edge calculation circuit 15D. Thereby, the controller 11A can calculate the skews between the data DA1 to DA8 and the data strobe signal DQS while calculating the intermediate timings, the skew correction can be made faster.

Next, the intermediate timing shift circuit 16F shifts the intermediate timings calculated by the intermediate timing calculation circuit 16D by the skews calculated by the strobe-data edge calculation circuit 15D. For example, for the data D1 of the data DA1, the intermediate timing (median Rise) of the data strobe signal DQS is corrected by two sampling times to correct the skew SK1 between the data D1 and the data strobe signal DQS. In this case, for the data D1, the intermediate timing (median Rise) of the data strobe signal DQS can be shifted from the sampling timing P14 to the sampling timing P12. Also for the data D2 to D7 of the data DA1, the intermediate timings of the data strobe signal DQS can be shifted respectively as with the data D1.

Next, the data selection circuit 16E selects the sampling values SD1 to SD8 obtained in the intermediate timings shifted by the intermediate timing shift circuit 16F as the values of the data DA1 to DA8 (S7). For example, for the data D1 of the data DA1, the sampling value SD1 obtained in the sampling timing P12 can be selected as the value of the data DA1.

Also for the data D2 to D7 of the data DA1, the sampling values SD1 obtained in the sampling timings P20, P28, P36, P44, P52, and P60 respectively can be selected as the values of the data DA1. In this case, the skews SK1 to SK7 of the data D1 to D7 can be corrected in real time based on the skews SK1 to SK7 calculated for the data D1 to D7 of the data DA1.

By calculating the skew SK1 between the data DA1 and the data strobe signal DQS based on the sampling values SD1 and SQ obtained by oversampling the data DA1 and the data strobe signal DQS respectively at the same time, it is possible to correct the skew SK1 between the data DA1 and the data strobe signal DQS without using a delay element delaying the data DA1 and the data strobe signal DQS.

Accordingly, it is possible to suppress degradation in the waveforms of the data DA1 and the data strobe signal DQS and reduce the circuit area and power consumption as compared to the method by which to correct the skew SK1 between the data DA1 and the data strobe signal DQS by the use of a delay element.

In addition, it is not necessary to adjust the delay amounts of the data DA1 and the data strobe signal DQS to match the edges of the data DA1 and the edges of the data strobe signal DQS while comparing the edge timings of the data DA1 and the edge timings of the data strobe signal DQS. Accordingly, the correction of the skew SK1 can be made faster as compared to the method by which to correct the skew SK1 between the data DA1 and the data strobe signal DQS by the use of a delay element.

Third Embodiment

Figure 5:
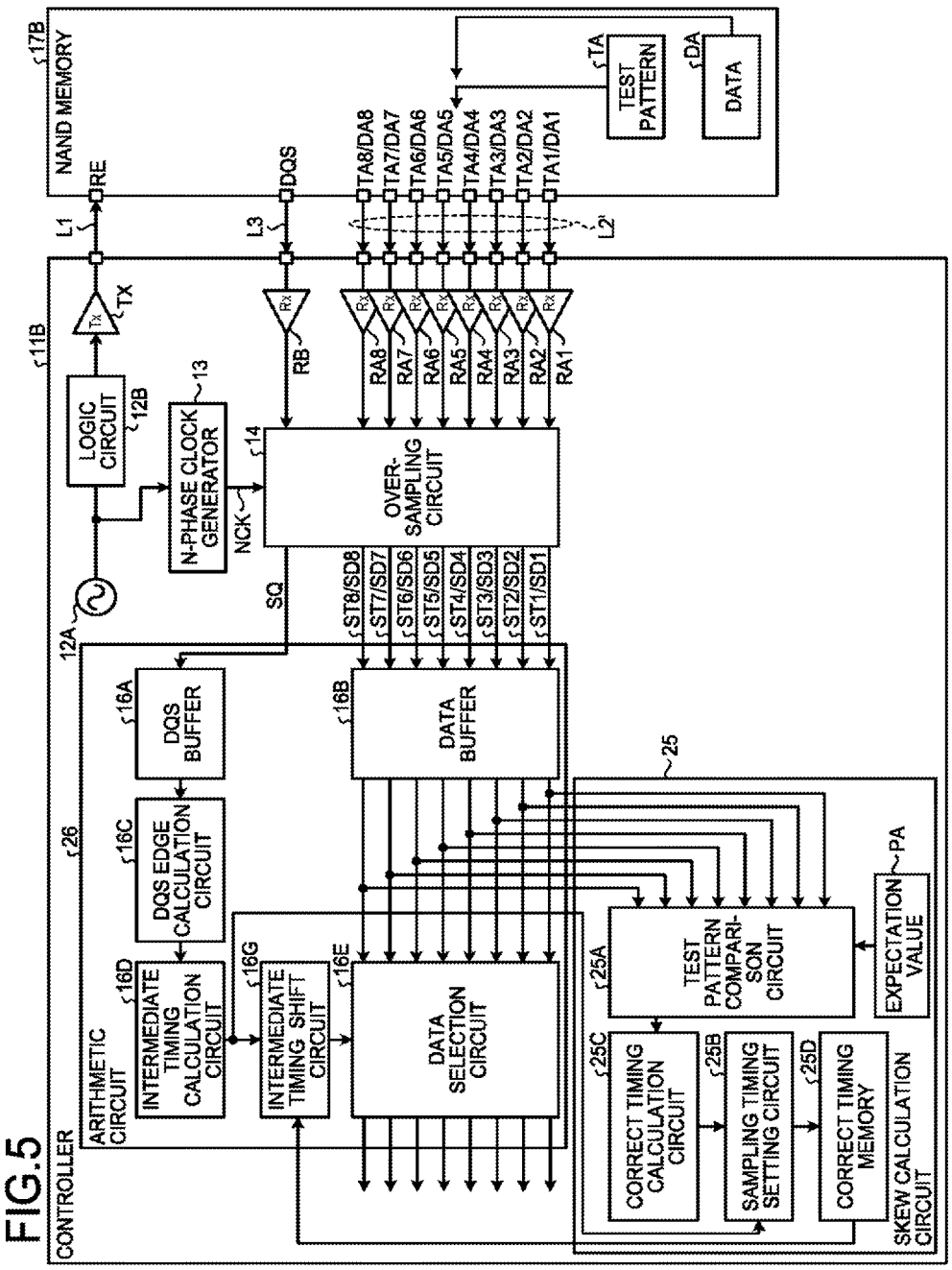
FIG. 5 is a schematic block diagram of a memory system to which a skew correcting device according to a third embodiment is applied.

FIG. 5 is a schematic block diagram of a memory system to which a skew correcting device according to a third embodiment is applied.

Referring to FIG. 5, the memory system includes a controller 11B and an NAND memory 17B. The controller 11B includes a skew calculation circuit 25 and an arithmetic circuit 26 instead of the skew calculation circuit 15 and the arithmetic circuit 16 illustrated in FIG. 3. The other components of the controller 11B can be the same as those of the controller 11A illustrated in FIG. 3. The NAND memory 17B can store a test pattern TA and data DA.

The skew calculation circuit 25 includes a test pattern comparison circuit 25A, a sampling timing setting circuit 25B, a correct timing calculation circuit 25C, and a correct timing memory 25D. The skew calculation circuit 25 can hold an expectation value PA corresponding to the test pattern TA.

The test pattern comparison circuit 25A can compare the test pattern TA sent from the NAND memory 17B to the expectation value PA. The correct timing calculation circuit 25C can calculate the correct timings of received results of the test pattern TA relative to the sampling timing of the data strobe signal DQS when the test pattern TA and the data strobe signal DQS are oversampled respectively at the same time.

The sampling timing setting circuit 25B can set the sampling timings of the data DA received together with the data strobe signal DQS based on the correct timings calculated by the correct timing calculation circuit 25C. In this case, the sampling timing setting circuit 25B can set the sampling timings of the test pattern TA corresponding to the correct timings calculated by the correct timing calculation circuit 25C in data windows. The correct timing memory 25D can store the data windows set by the sampling timing setting circuit 25B.

The arithmetic circuit 26 includes an intermediate timing shift circuit 16G instead of the intermediate timing shift circuit 16F illustrated in FIG. 3. The other components of the arithmetic circuit 26 can be the same as those of the arithmetic circuit 16 illustrated in FIG. 3.

The intermediate timing shift circuit 16G can shift the intermediate timings calculated by the intermediate timing calculation circuit 16D to fall within the data windows. For example, the intermediate timing shift circuit 16G can shift the central timing between the edge timings of the data strobe signal DQS to coincide with the central timing within the data window.

The controller 11B illustrated in FIG. 5 performs a test pattern receiving operation and a data receiving operation. In the test pattern receiving operation, skews are calculated by the use of the test pattern. In the data receiving operation, the skews of the data are corrected based on the skews calculated by the use of the test pattern.

FIG. 6 is a timing chart describing the test pattern receiving operation of the skew correcting device with jitter according to the third embodiment. FIG. 6 describes the process of the test pattern TA1 out of the test patterns TA1 to TA8 as an example. However, the processes of the test patterns TA2 to TA8 can be performed in parallel to the process of the test pattern TA1.

Referring to FIG. 6, the logic circuit 12B generates a read enable signal RE based on a clock CLK generated by the clock generator 12A and transmits the same to the NAND memory 17B. The NAND memory 17B transmits the test patterns TA1 to TA8 to the controller 11B in synchronization with the read enable signal RE. The test patterns TA1 to TA8 can be the test pattern TA. The NAND memory 17B also transmits the read enable signal RE received from the controller 11B as a data strobe signal DQS to the controller 11B.

The controller 11B inputs the clock CLK generated by the clock generator 12A into the N-phase clock generator 13. The N-phase clock generator 13 generates an N-phase clock NCK based on the clock CLK and outputs the same to the oversampling circuit 14.

The oversampling circuit 14 samples the data strobe signal DQS in sampling timings P1 to P10 corresponding to the edge timings of the phases of the N-phase clock NCK, and generates sampling values SQ corresponding to the sampling timings P1 to P10. The sampling values SQ are held in the DQS buffer 16A.

The oversampling circuit 14 samples the test patterns TA1 to TA8 in the sampling timings P1 to P10 corresponding to the edge timings of the phases of the N-phase clock NCK, and generates sampling values ST1 to ST8 corresponding to the sampling timings P1 to P10. These sampling values ST1 to ST8 are held in the data buffer 16B.

For example, the test patterns T1 to T3 are input as test patterns TA1 to the controller 11B in the sampling timings P1 to P10. In this case, T1=0, T2=1, and T3=0. The test patterns T1 to T3 can be repeatedly input into the controller 11B at times t1 to t3. In this case, jitter JT occurs during the receipt of the test patterns T1 to T3.

In the sampling timings P1 to P10, sampling values ST1(t1) of the test patterns T1 to T3 input at time t1 reach 0111100001. In the sampling timings P1 to P10, sampling values ST1(t2) of the test patterns T1 to T3 input at time t2 reach 0011110000. In the sampling timings P1 to P10, sampling values ST1(t3) of the test pattern T1 to T3 input at time t3 reach 0001111000.

In this case, when T1=0, T2=1, and T3=0, expectation values PA are 0111100001 in the sampling timings P1 to P10.

In addition, the test pattern comparison circuit 25A compares the sampling values ST1(t1) to ST1(t3) with the expectation values PA in the individual sampling timings P1 to P10. In this case, when all the sampling values ST1(t1) to ST1(t3) coincide with the expectation values PA in the sampling timings P1 to P10, the comparison results are regarded as correct. When any one of the sampling values ST1(t1) to ST1(t3) does not coincide with the expectation value PA, the comparison result is regarded as incorrect.

The sampling timing setting circuit 25B sets data windows WA and WB based on the sampling timings P1 to P10 regarded as correct by the test pattern comparison circuit 25A. The data window WA can include the sampling timings P4 and P5, and the data window WB can include the sampling timings P8 and P9. The data windows WA and WB are stored in the correct timing memory 25D.

Upon completion of the test pattern receiving operation, the system can move to the data receiving operation.

Referring to FIG. 5, the logic circuit 12B generates a read enable signal RE based on a clock CLK generated by the clock generator 12A and transmits the same to the NAND memory 17B. The NAND memory 17B transmits the data DA1 to DA8 to the controller 11B in synchronization with the read enable signal RE. The NAND memory 17B transmits the read enable signal RE received from the controller 11B as the data strobe signal DQS to the controller 11B.

The controller 11B inputs the clock CLK generated by the clock generator 12A into the N-phase clock generator 13. The N-phase clock generator 13 generates an N-phase clock NCK based on the clock CLK and outputs the same to the oversampling circuit 14.

The oversampling circuit 14 samples a data strobe signal DQS in the sampling timings P1 to P10 corresponding to the edge timings of the phases of the N-phase clock NCK, and generates the sampling values SQ corresponding to the sampling timings P1 to P10. The sampling values SQ are held in the DQS buffer 16A.

The oversampling circuit 14 samples the data DA1 to DA8 in the sampling timings P1 to P10 corresponding to the edge timings of the phases of the N-phase clock NCK, and generates the sampling values SD1 to SD8 corresponding to the sampling timings P1 to P10. These sampling values SD1 to SD8 are held in the data buffer 16B.

Next, the DQS edge calculation circuit 16C calculates the edge timings of the data strobe signal DQS based on the sampling values SQ of the data strobe signal DQS. In this case, the edge timings of the data strobe signal DQS can be set as sampling timings where the sampling value SQ changes between 0 and 1.

Next, the intermediate timing calculation circuit 16D calculates intermediate timings between the edge timings of the data strobe signal DQS based on the edge timings calculated by the DQS edge calculation circuit 16C.

Next, the intermediate timing shift circuit 16G shifts the intermediate timings calculated by the intermediate timing calculation circuit 16D such that the intermediate timings calculated by the intermediate timing calculation circuit 16D fall within the data windows stored in the correct timing memory 25D. For example, for the test pattern TA1, data windows WA and WB are set as illustrated in FIG. 6. In this case, the sampling values SQ in the sampling timings P3 and P4 of the data strobe signal DQS can be shifted to the sampling timings P4 and P5, and the sampling values SQ in the sampling timings P7 and P8 of the data strobe signal DQS can be shifted to the sampling timings P8 and P9.

Next, the data selection circuit 16E selects the sampling values SD1 to SD8 obtained in the intermediate timings shifted by the intermediate timing shift circuit 16G as values of the data DA1 to DA8. For example, the data DA1 corresponding to a transmission sequence of the test pattern TA1 illustrated in FIG. 6 is sent to the controller 11B. In this case, the data D1 to D3 are sent to the controller 11B corresponding to a transmission sequence of the test patterns T1 to T3 of the test pattern TA1.

At that time, for the data D2, the sampling values SD1 obtained in the sampling timings P4 and P5 in the data window WA can be selected as values of the data DA1. For the data D3, the sampling values SD1 obtained in the sampling timings P8 and P9 in the data window WB can be selected as values of the data DA1.

Accordingly, it is possible to determine the data DA1 with high accuracy even when the jitter JT similar to that at the time of receipt of the test pattern TA1 occurs at the time of receipt of the data DA1.

According to the method by which to compare the test pattern TA1 with the expectation value PA to calculate the skew, it is not necessary to calculate the edge timings of the test pattern TA1 for calculation of the skew. Accordingly, it is possible to correct the skew in the data DA1 even when the edge timings of the data DA1 cannot be calculated because the data DA1 includes repeated patterns of the same value.

In the process of FIG. 6, the accuracy of data determination can be improved even in the event of occurrence of jitter at the time of data reception. According to the method by which to compare the test pattern with the expectation value, the accuracy of data determination can be improved even with variations in the data strobe signal and the duty of the data.

Figure 7A:
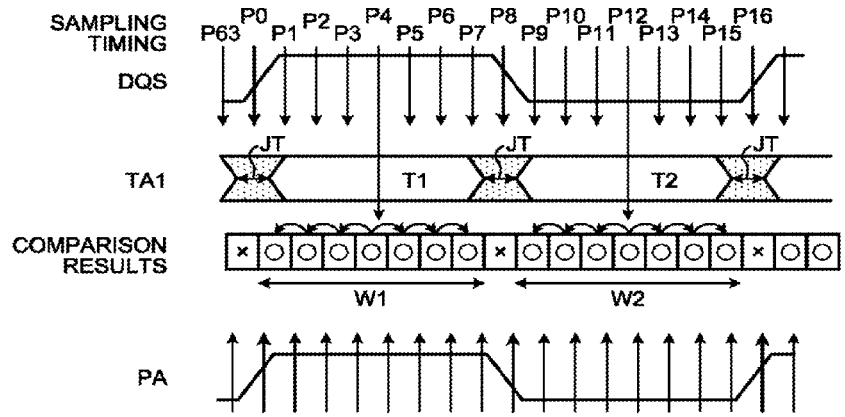
FIG. 7A is a timing chart describing a method of setting data windows in the skew correcting device with jitter and without skew according to the third embodiment.
Figure 7B:
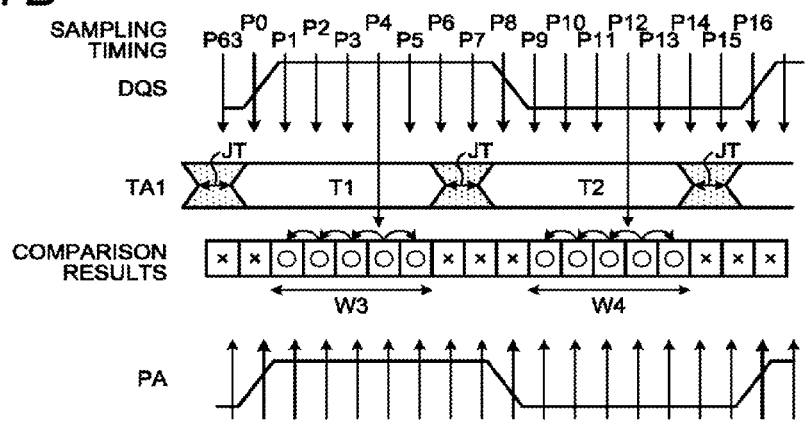
FIGS. 7B and 7C are timing charts describing methods of setting data windows in the skew correcting device with jitter and skews according to the third embodiment.
Figure 7C:
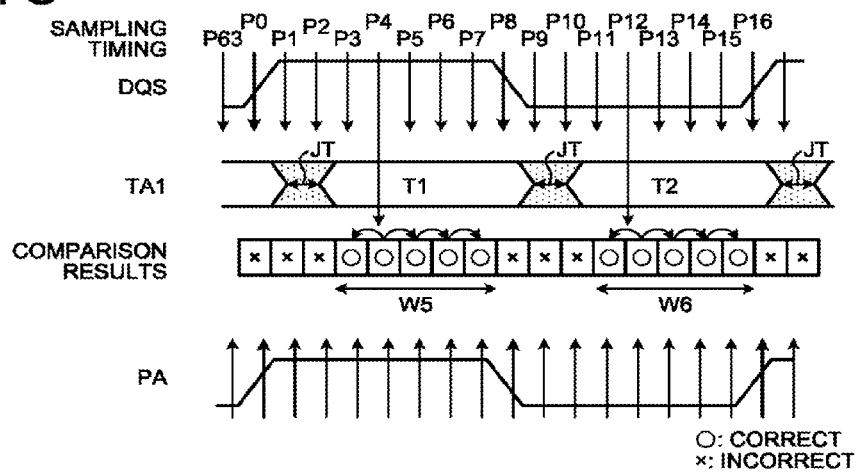

FIG. 7A is a timing chart describing a method of setting data windows in the skew correcting device with jitter and without skew according to the third embodiment, and FIGS. 7B and 7C are timing charts describing methods of setting data windows in the skew correcting device with jitter and skews according to the third embodiment. FIGS. 7A to 7C describe the process of the test pattern TA1 out of the test patterns TA1 to TAB. However, the processes of the test patterns TA2 to TAB can be performed in parallel to the process of the test pattern TA1.

As illustrated in FIG. 7A, the test patterns T1 and T2 are input as the test patterns TA1 into the controller 11B in the sampling timings P0 to P16. In this case, T1=1 and T2=0. At that time, the test patterns T1 and T2 can be repeatedly input into the controller 11B. In this case, the jitter JT occurs at the time of receipt of the test patterns T1 and T2. In addition, there is no delay between the test patterns T1 and T2 and the data strobe signal DQS.

The DQS edge calculation circuit 16C illustrated in FIG. 5 calculates the edge timings of the data strobe signal DQS. The calculated edge timings are the sampling timings P0, P8, and P15.

Next, the intermediate timing calculation circuit 16D calculates the central timings between the edge timings of the data strobe signal DQS. The calculated central timings are the sampling timing P4 between the sampling timings P0 and P8 and the sampling timing P12 between the sampling timings P8 and P15.

Meanwhile, the test pattern comparison circuit 25A compares overlapping patterns obtained by repeatedly receiving the test patterns T1 and T2 to the expectation value PA. When the correct timing calculation circuit 25C determines the sampling timings P1 to P7 as correct in the test pattern T1, the sampling timing setting circuit 25B sets a data window W1 in the sampling timings P1 to P7.

The sampling timing setting circuit 25B calculates the central timing of the data window W1. The calculated central timing is the sampling timing P4. The sampling timing setting circuit 25B compares the central timing of the data window W1 to the central timing of the data strobe signal DQS. When the central timing of the data window W1 coincides with the central timing of the data strobe signal DQS, the sampling timing setting circuit 25B determines the central timing of the data strobe signal DQS as not needed to be moved.

For the test pattern T1, the data window W1 and the amount of movement of the central timing of the data strobe signal DQS can be stored in the correct timing memory 25D.

For the test pattern T2, when the correct timing calculation circuit 25C determines the sampling timings P9 to P15 as correct, the sampling timing setting circuit 25B sets a data window W2 in the sampling timings P9 to P15.

The sampling timing setting circuit 25B calculates the central timing of the data window W2. The calculated central timing is the sampling timing P12. The sampling timing setting circuit 25B compares the central timing of the data window W2 to the central timing of the data strobe signal DQS. When the central timing of the data window W2 coincides with the central timing of the data strobe signal DQS, the sampling timing setting circuit 25B determines the central timing of the data strobe signal DQS as not needed to be moved.

For the test pattern T2, the data window W2 and the amount of movement of the central timing of the data strobe signal DQS can be stored in the correct timing memory 25D.

Next, the data D1 and D2 corresponding to a transmission sequence of the test patterns T1 and T2 are input into the controller 11B. The data D1 and D2 are included in the data SD1.

At the time of receipt of the data D1, the amount of movement of the central timing of the data strobe signal DQS in the test pattern T1 is read from the correct timing memory 25D. When the amount of movement of the central timing of the data strobe signal DQS is 0, the intermediate timing shift circuit 16G does not move the central timing of the data strobe signal DQS but inputs the sampling timing P4 as the central timing of the data strobe signal DQS into the data selection circuit 16E.

The data selection circuit 16E selects the sampling value SD1 of the data D1 in the sampling timing P4 as the value of the data D1.

At the time of receipt of the data D2, the amount of movement of the central timing of the data strobe signal DQS in the test pattern T2 is read from the correct timing memory 25D. When the amount of movement of the central timing of the data strobe signal DQS is 0, the central timing shift circuit 16G does not move the central timing of the data strobe signal DQS but inputs the sampling timing P12 as the central timing of the data strobe signal DQS into the data selection circuit 16E.

The data selection circuit 16E selects the sampling value SD1 of the data D2 in the sampling timing P12 as the value of the data D2.

In the example of FIG. 7B, the test patterns T1 and T2 are received by the controller 11B ahead of the data strobe signal DQS.

In this case, the central timing between the edge timings of the data strobe signal DQS is calculated in the same manner as the process of FIG. 7A.

Meanwhile, the test pattern comparison circuit 25A compares overlapping patterns obtained by repeatedly receiving the test patterns T1 and T2 to the expectation value PA. In addition, when the correct timing calculation circuit 25C determines the sampling timings P1 to P5 as correct in the test pattern T1, the sampling timing setting circuit 25B sets a data window W3 in the sampling timings P1 to P5.

The sampling timing setting circuit 25B calculates the central timing of the data window W3. The calculated central timing is the sampling timing P3. Then, the sampling timing setting circuit 25B compares the central timing of the data window W3 to the central timing of the data strobe signal DQS. When the central timing of the data window W3 is shifted leftward (in the direction in which time lags) by one sampling time from the central timing of the data strobe signal DQS, the sampling timing setting circuit 25B sets the one leftward sampling time as the amount of movement of the central timing of the data strobe signal DQS.

For the test pattern T1, the data window W3 and the amount of movement of the central timing of the data strobe signal DQS can be stored in the correct timing memory 25D.

For the test pattern T2, when the correct timing calculation circuit 25C determines the sampling timings P9 to P13 as correct, the sampling timing setting circuit 25B sets a data window W4 in the sampling timings P9 to P13.

The sampling timing setting circuit 25B calculates the central timing of the data window W4. The calculated central timing is the sampling timing P11. Then, the sampling timing setting circuit 25B compares the central timing of the data window W4 to the central timing of the data strobe signal DQS. When the central timing of the data window W4 is shifted leftward by one sampling time from the central timing of the data strobe signal DQS, the sampling timing setting circuit 25B sets the one leftward sampling time as the amount of movement of the central timing of the data strobe signal DQS.

For the test pattern T2, the data window W4 and the amount of movement of the central timing of the data strobe signal DQS can be stored in the correct timing memory 25D.

Next, the data D1 and D2 corresponding to the transmission sequence of the test patterns T1 and T2 are input into the controller 11B. The data D1 and D2 are included in the data SD1.

At the time of receipt of the data D1, the amount of movement of the central timing of the data strobe signal DQS in the test pattern T1 is read from the correct timing memory 25D. When the amount of movement of the central timing of the data strobe signal DQS is one leftward sampling time, the intermediate timing shift circuit 16G shifts the central timing of the data strobe signal DQS leftward by one sampling time, and inputs the sampling timing P3 as the central timing of the data strobe signal DQS into the data selection circuit 16E.

The data selection circuit 16E selects the sampling value SD1 of the data D1 in the sampling timing P3 as the value of the data D1.

At the time of receipt of the data D2, the amount of movement of the central timing of the data strobe signal DQS in the test pattern T2 is read from the correct timing memory 25D. When the amount of movement of the central timing of the data strobe signal DQS is one leftward sampling time, the intermediate timing shift circuit 16G shifts the central timing of the data strobe signal DQS leftward by one sampling time, and inputs the sampling timing P11 as the central timing of the data strobe signal DQS into the data selection circuit 16E.

The data selection circuit 16E selects the sampling value SD1 of the data D2 in the sampling timing P11 as the value of the data D2.

In the example of FIG. 7C, the test patterns T1 and T2 are received by the controller 11B lagging behind the data strobe signal DQS.

At that time, the central timing between the edge timings of the data strobe signal DQS is calculated in the same manner as the process illustrated in FIG. 7A.

Meanwhile, the test pattern comparison circuit 25A compares overlapping patterns obtained by repeatedly receiving the test patterns T1 and T2 to the expectation value PA. In addition, when the correct timing calculation circuit 25C determines the sampling timings P3 to P7 as correct in the test pattern T1, the sampling timing setting circuit 25B sets a data window W5 in the sampling timings P3 to P7.

The sampling timing setting circuit 25B calculates the central timing of the data window W5. The calculated central timing is the sampling timing P5. The sampling timing setting circuit 25B compares the central timing of the data window W5 to the central timing of the data strobe signal DQS. When the central timing of the data window W5 is shifted rightward (in the direction in which time progresses) by one sampling time from the central timing of the data strobe signal DQS, the sampling timing setting circuit 25B sets the one rightward sampling time as the amount of movement of the central timing of the data strobe signal DQS.

For the test pattern T1, the data window W5 and the amount of movement of the central timing of the data strobe signal DQS can be stored in the correct timing memory 25D.

For the test pattern T2, when the correct timing calculation circuit 25C determines the sampling timings P11 to P15 as correct, the sampling timing setting circuit 25B sets a data window W6 in the sampling timings P11 to P15.

The sampling timing setting circuit 25B calculates the central timing of the data window W6. The calculated central timing is the sampling timing P13. Then, the sampling timing setting circuit 25B compares the central timing of the data window W6 to the central timing of the data strobe signal DQS. When the central timing of the data window W6 is shifted rightward by one sampling time from the central timing of the data strobe signal DQS, the sampling timing setting circuit 25B sets the one rightward sampling time as the amount of movement of the central timing of the data strobe signal DQS.

For the test pattern T2, the data window W6 and the amount of movement of the central timing of the data strobe signal DQS can be stored in the correct timing memory 25D.

Next, the data D1 and D2 corresponding to the transmission sequence of the test patterns T1 and T2 are input into the controller 11B. The data D1 and D2 are included in the data SD1.

At the time of receipt of the data D1, the amount of movement of the central timing of the data strobe signal DQS in the test pattern T1 is read from the correct timing memory 25D. When the amount of movement of the central timing of the data strobe signal DQS is one rightward sampling time, the intermediate timing shift circuit 16G shifts the central timing of the data strobe signal DQS rightward by one sampling time, and inputs the sampling timing P5 as the central timing of the data strobe signal DQS into the data selection circuit 16E.

The data selection circuit 16E selects the sampling value SD1 of the data D1 in the sampling timing P5 as the value of the data D1.

At the time of receipt of the data D2, the amount of movement of the central timing of the data strobe signal DQS in the test pattern T2 is read from the correct timing memory 25D. When the amount of movement of the central timing of the data strobe signal DQS is one rightward sampling time, the intermediate timing shift circuit 16G shifts the central timing of the data strobe signal DQS rightward by one sampling time, and inputs the sampling timing P13 as the central timing of the data strobe signal DQS into the data selection circuit 16E.

The data selection circuit 16E selects the sampling value SD1 of the data D2 in the sampling timing P13 as the value of the data D2.

As described above, according to the method by which to determine the value at the time of data reception based on the status at the time of test pattern reception, it is possible to improve the accuracy of data determination not only when jitter occurs at the time of data receipt but also when the amount of delay is different between the data strobe signal and the data.

The test pattern TA of FIG. 5 can be stored in a memory cell array of the NAND memory 17B together with the data DA. The test pattern TA can be stored in a first area specified by a first address. The data DA can be stored in a second area specified by a second address. The first address and the second address can be managed by the controller 11B.

The controller 11B can execute a test pattern receiving operation and a data receiving operation.

In the test pattern receiving operation, the test pattern TA can be read from the NAND memory 17B by specifying the first address. Then, the correct timing of the test pattern TA can be calculated from the received result of the test pattern TA.

In the data receiving operation, the data DA can be read from the NAND memory 17B by specifying the second address. Then, the sampling timing of the data DA can be corrected based on the correct timing of the test pattern TA.

In the method by which the controller 11B specifies the address of the test pattern TA to receive the test pattern TA, the same command as that used by the controller 11B to receive the data DA can be used. Accordingly, the controller 11B is allowed to receive the test pattern TA by storing only the test pattern TA in the NAND memory 17B. This eliminates the need to change the configuration of the NAND memory 17B.

In relation to the foregoing embodiment, the method of correcting the skew between the data strobe signal and the data has been described. However, the embodiment may be applied to the method of correcting the skew between a command strobe signal and a command or may be applied to the method of correcting the skew between an address strobe signal and an address.

In relation to the foregoing embodiment, the method of correcting the skew between the data strobe signal and the data (read data) received by the controller has been described. However, the embodiment may be applied to the method of correcting the skew between the data strobe signal and data (write data) received by the NAND memory.

In the foregoing embodiment, the skew correcting device is applied to communications between the controller and the NAND memory as an example. Alternatively, the skew correcting device may be applied to communications between a client and a server or may be applied to communications between a base station and a portable terminal.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A reception circuit comprising:
a skew calculation circuit that calculates, based on first sampled values and second sampled values, a skew between data and a strobe signal, the first sampled values being obtained by sampling the data at a cycle one half of or shorter than one half of a cycle of the strobe signal with using an N-phase clock (N represents an integer of 2 or larger), the second sampled values being obtained by sampling the strobe signal at the cycle one half of or shorter than one half of the cycle of the strobe signal with using the N-phase clock; and
a sampling timing correction circuit that corrects sampling timings of the data based on the skew calculated by the skew calculation circuit.

2. The reception circuit of claim 1, wherein
the skew calculation circuit includes:
an edge timing calculation circuit that calculates edge timings of the data and the strobe signal respectively based on the first and second sampled values; and
an edge timing difference circuit that calculates a difference between the edge timings of the data and the strobe signal, and wherein
the skew calculation circuit sets the difference between the edge timings as the skew.

3. The reception circuit of claim 2, wherein
the edge timing calculation circuit sets the sampling timings where the first sampled value of the data changes between 0 and 1 as the edge timings of the data, and the edge timing calculation circuit sets the sampling timings where the second sampled value of the strobe signal changes between 0 and 1 as the edge timings of the strobe signal.

4. The reception circuit of claim 2, further comprising:
a data determination circuit that determines whether the data is 0 or 1 based on the first sampled values obtained in the sampling timings after the correction.

5. The reception circuit of claim 4, further comprising:
an intermediate timing calculation circuit that calculates an intermediate timing between the edge timings of the strobe signal, wherein
the sampling timing correction circuit shifts the intermediate timing by the skew; and
the data determination circuit selects the first sampled value obtained in the shifted intermediate timing as the value of the data.

6. The reception circuit of claim 5, wherein
the intermediate timing is a substantially central timing between a rising edge timing and a falling edge timing of the strobe signal.

7. The reception circuit of claim 1, further comprising:
a first oversampling circuit that samples, at a cycle one half of or shorter than one half of a cycle of the strobe signal, the data based on the N-phase clock; and
a second oversampling circuit that samples, at a cycle one half of or shorter than one half of a cycle of the strobe signal, the strobe signal based on the N-phase clock.

8. The reception circuit of claim 7, wherein
the first oversampling circuit includes:
    a first latch circuit that latches the data based on a clock in a first phase of the N-phase clock; and
    a second latch circuit that latches the data based on a clock in a second phase of the N-phase clock, and
the second oversampling circuit includes:
    a third latch circuit that latches the strobe signal based on the clock in the first phase of the N-phase clock; and
    a fourth latch circuit that latches the strobe signal based on the clock in the second phase of the N-phase clock.

9. The reception circuit of claim 1, further comprising:
a controller receives the data and the strobe signal from a NAND memory.

10. The reception circuit of claim 9, wherein the strobe signal is generated based on a read enable signal output from the controller.

11. A reception circuit comprising:
a correct timing calculation circuit that calculates, based on first sampled values and second sampled values, a correct timing of sampling timings of a test pattern relative to a sampling timing of a strobe signal when the test pattern and the strobe signal are sampled, the first sampled values being obtained by sampling the test pattern at a cycle one half of or shorter than one half of a cycle of the strobe signal with using an N-phase clock (N represents an integer of 2 or larger), the second sampled values being obtained by sampling the strobe signal at the cycle one half of or shorter than one half of the cycle of the strobe signal with using the N-phase clock; and
a sampling timing setting circuit that sets sampling timing of data received together with the strobe signal based on the correct timing calculated by the correct timing calculation circuit.

12. The reception circuit of claim 11, further comprising:
a selection circuit that sets the sampling timing of the test pattern corresponding to the correct timing in a data window and selects a sampling value within the data window as a value of the data.

13. The reception circuit of claim 11, further comprising:
a comparison circuit that compares a sampling value obtained by repeatedly inputting of the test pattern with an expectation value for individual sampling timings.

14. The reception circuit of claim 12, further comprising:
an intermediate timing calculation circuit that calculates an intermediate timing between edge timings of the strobe signal; and
an intermediate timing shift circuit that shifts the calculated intermediate timing such that the intermediate timing falls within the data window; wherein
the selection circuit selects a sampling value obtained in the shifted intermediate timing as the value of the data.

15. The reception circuit of claim 14, wherein
the intermediate timing shift circuit shifts a central timing between the edge timings of the strobe signal such that the central timing between the edge timings of the strobe signal coincides with a central timing within the data window, and
the selection circuit selects the first sampled value obtained in the central timing of the strobe signal as the value of the data.

16. The reception circuit of claim 11, further comprising:
a first oversampling circuit that samples, at a cycle one half of or shorter than one half of a cycle of the strobe signal, the data based on the N-phase clock; and
a second oversampling circuit that samples, at a cycle one half of or shorter than one half of a cycle of the strobe signal, the strobe signal based on the N-phase clock.

17. The reception circuit of claim 16, wherein
the first oversampling circuit includes:
    a first latch circuit that latches the data based on a clock in a first phase of the N-phase clock; and
    a second latch circuit that latches the data based on a clock in a second phase of the N-phase clock, and
the second oversampling circuit includes:
    a third latch circuit that latches the strobe signal based on the clock in the first phase of the N-phase clock; and
    a fourth latch circuit that latches the strobe signal based on the clock in the second phase of the N-phase clock.

18. The reception circuit of claim 12, further comprising:
a controller receives the data and the strobe signal from a NAND memory.

19. The reception circuit of claim 18, wherein the strobe signal is generated based on a read enable signal output from the controller.

20. The reception circuit of claim 18, wherein
the test pattern is stored in a first area of the NAND memory specified by a first address, and the data is stored in a second area of the NAND memory specified by a second address,
the controller reads the test pattern from the NAND memory by specifying the first address,
the controller calculates the correct timing of the test pattern from a received result of the test pattern,
the controller reads the test pattern from the NAND memory by specifying the second address, and
the controller corrects the sampling timing of the data based on the correct timing of the test pattern.

* * * * *